US010879185B2

(12) United States Patent
Chiu et al.

(10) Patent No.: US 10,879,185 B2
(45) Date of Patent: Dec. 29, 2020

(54) PACKAGE STRUCTURE WITH BUMP

(71) Applicant: Taiwan Semiconductor Manufacturing Co., Ltd., Hsinchu (TW)

(72) Inventors: Ming-Yen Chiu, Zhubei (TW); Hsin-Chieh Huang, Hsinchu (TW); Ching-Fu Chang, Taipei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/725,321

(22) Filed: Dec. 23, 2019

(65) Prior Publication Data
US 2020/0135651 A1    Apr. 30, 2020

Related U.S. Application Data

(63) Continuation of application No. 15/284,425, filed on Oct. 3, 2016, now Pat. No. 10,515,899.

(51) Int. Cl.
*H01L 23/538* (2006.01)
*H01L 23/00* (2006.01)
(Continued)

(52) U.S. Cl.
CPC ...... *H01L 23/5386* (2013.01); *H01L 23/3114* (2013.01); *H01L 23/3128* (2013.01); *H01L 23/5383* (2013.01); *H01L 23/5384* (2013.01); *H01L 23/5389* (2013.01); *H01L 24/05* (2013.01); *H01L 24/13* (2013.01); *H01L 24/14* (2013.01); *H01L 24/16* (2013.01); *H01L 24/17* (2013.01); *H01L 25/105* (2013.01); *H01L 23/49816* (2013.01); *H01L 25/0655* (2013.01); *H01L 2224/0401* (2013.01); *H01L 2224/05024* (2013.01); *H01L 2224/13026* (2013.01);
(Continued)

(58) Field of Classification Search
CPC ............ H01L 23/5389; H01L 23/3114; H01L 23/5386; H01L 24/14; H01L 24/17
See application file for complete search history.

(56) References Cited

U.S. PATENT DOCUMENTS

8,361,842 B2   1/2013   Yu et al.
8,680,647 B2   3/2014   Yu et al.
(Continued)

*Primary Examiner* — Zandra V Smith
*Assistant Examiner* — Abbigale A Boyle
(74) *Attorney, Agent, or Firm* — McClure, Qualey & Rodack, LLP (57) ABSTRACT

A package structure is provided. The package structure includes a redistribution layer and a first integrated circuit chip having a first chip edge and a second integrated circuit chip having a second chip edge over the redistribution layer. The package structure also includes first bumps electrically connected to the first integrated circuit chip through the redistribution layer. In addition, the first bumps overlap the first integrated circuit chip and are arranged along a first chip edge of the first integrated circuit chip. The package structure further includes second bumps electrically connected to the first integrated circuit chip through the redistribution layer without overlapping the first integrated circuit chip and the second integrated circuit chip. In addition, none of the second bumps is arranged between the first chip edge and the second chip edge.

20 Claims, 4 Drawing Sheets

(51) Int. Cl.
    *H01L 25/10*         (2006.01)
    *H01L 23/31*         (2006.01)
    *H01L 25/065*       (2006.01)
    *H01L 23/498*       (2006.01)

(52) U.S. Cl.
    CPC ............ *H01L 2224/14135* (2013.01); *H01L 2224/16227* (2013.01); *H01L 2225/1035* (2013.01); *H01L 2225/1058* (2013.01); *H01L 2924/351* (2013.01)

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2007/0256858 A1* | 11/2007 | Kariya ............... H01L 21/4857 174/260 |
| 2011/0031619 A1 | 2/2011 | Chen et al. |
| 2011/0254155 A1 | 10/2011 | Lin et al. |
| 2011/0291288 A1 | 12/2011 | Wu et al. |
| 2013/0026622 A1 | 1/2013 | Chuang et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0249106 A1* | 9/2013 | Lin ..................... H01L 24/19 257/774 |
| 2013/0264684 A1 | 10/2013 | Yu et al. |
| 2013/0307140 A1 | 11/2013 | Huang et al. |
| 2014/0110832 A1 | 4/2014 | Crisp et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

\* cited by examiner

PACKAGE STRUCTURE WITH BUMP

CROSS REFERENCE TO RELATED APPLICATIONS

This application is a Continuation application of U.S. patent application Ser. No. 15/284,425, filed on Oct. 3, 2016, now U.S. Pat. No. 10,515,899, the entire of which is incorporated by reference herein.

BACKGROUND

With the constant evolution of semiconductor technology, semiconductor dies are increasingly becoming smaller. More functions, however, need to be integrated into these semiconductor dies. Accordingly, these semiconductor dies have increasingly greater numbers of I/O pads packaged into smaller areas, and the density of the I/O pads is quickly rising. As a result, the packaging of semiconductor dies is becoming more difficult.

Package technologies can be divided into multiple categories. In one of the categories of packaging, dies are sawed from wafers before they are packaged onto other wafers, and only "known-good-dies" are packaged. An advantage of this packaging technology is the possibility of forming fan-out chip packages, which means that the I/O pads on a die can be redistributed to a greater area than the die itself. Therefore, the number of I/O pads packed on the surfaces of the dies can be increased.

New packaging technologies have been developed to further improve the density and functions of semiconductor dies. These relatively new types of packaging technologies for semiconductor dies face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure provide a package structure with improved reliability. Stress, which may be caused by a mismatch of the coefficient of thermal expansion (CTE) between multiple heterogeneous materials in the package structure, is distributed. Therefore, damage to the package structure that may result from stress concentration is mitigated or eliminated.

Figure 1:
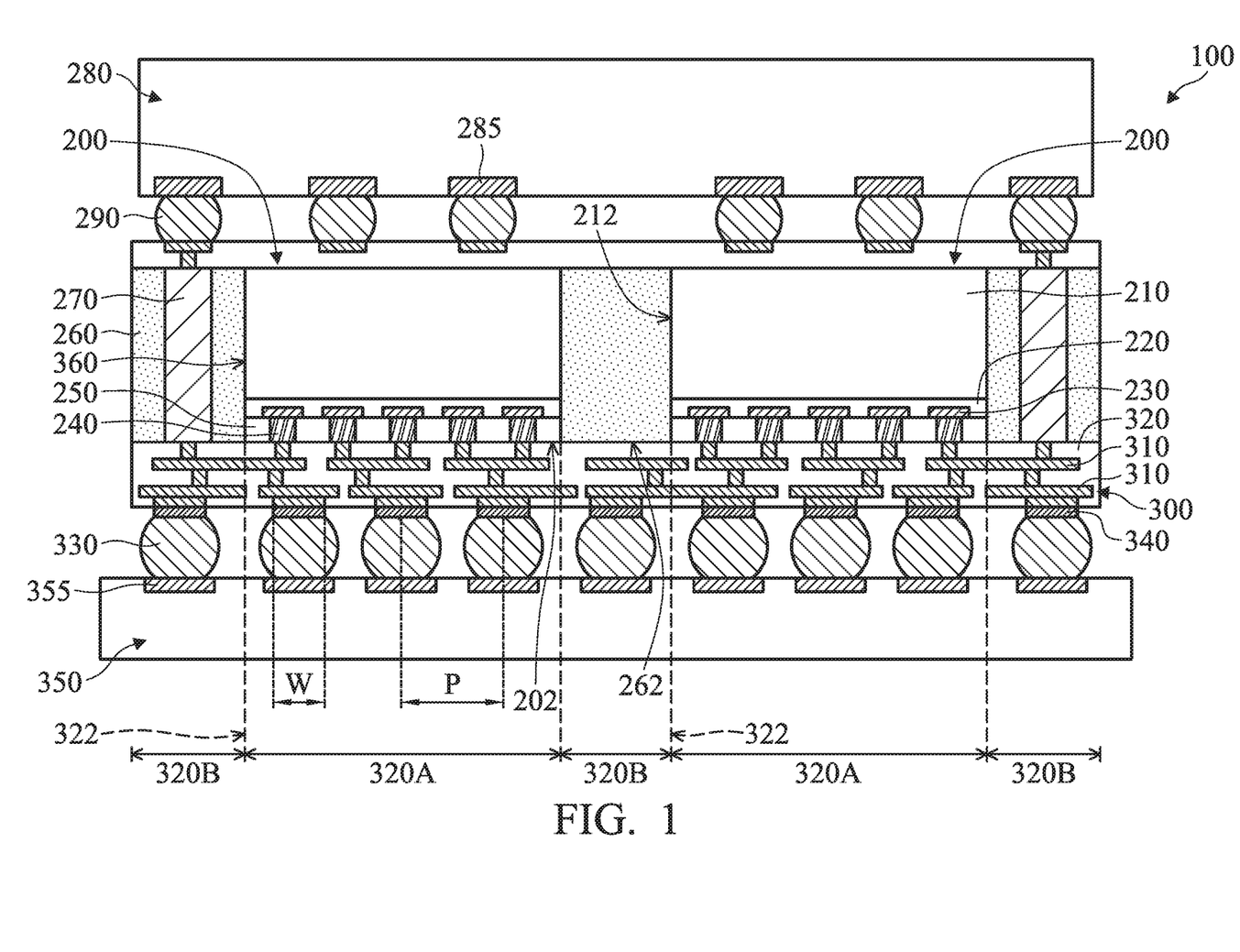
FIG. 1 is a cross-sectional view of a package structure, in accordance with some embodiments.

Some embodiments of the package structure are described. FIG. 1 is a cross-sectional view of a package structure, in accordance with some embodiments. Additional features can be added to the package structure. Some of the features described below can be replaced or eliminated for different embodiments.

As shown in FIG. 1, a package structure 100 includes multiple integrated circuit chips 200, in accordance with some embodiments. In some embodiments, the integrated circuit chips 200 have an active surface 202. The integrated circuit chips 200 may be device chips/dies including transistors, diodes, or other suitable integrated circuit elements. The device chips may also include capacitors, inductors, resistors, other integrated circuit elements, or a combination thereof. In some embodiments, the integrated circuit chips 200 are sensor chips, logic chips, central processing unit (CPU) chips, memory chips, or other suitable chips. The integrated circuit chips 200 may have substantially the same size or different sizes according to requirements.

Each of the integrated circuit chips 200 may include a semiconductor substrate 210, a passivation layer 220, conductive pads 230, connectors 240, and a protection layer 250. In some embodiments, the semiconductor substrate 210 includes silicon or another elementary semiconductor material such as germanium. In some other embodiments, the semiconductor substrate 210 includes a compound semiconductor. The compound semiconductor may include silicon germanium, gallium arsenide, silicon carbide, another suitable compound semiconductor, or a combination thereof.

A variety of device elements may be formed in or over the semiconductor substrate 210. The device elements include active devices and/or passive devices. The conductive pads 230 are in the passivation layer 220 and are electrically connected to the device elements. The connectors 240 are surrounded by the protection layer 250 and are electrically connected to the conductive pads 230.

Although FIG. 1 shows that the package structure 100 includes multiple integrated circuit chips 200, embodiments of the disclosure are not limited thereto. In some other embodiments, the package structure 100 includes only one integrated circuit die 200.

As shown in FIG. 1, the integrated circuit chips 200 are continuously surrounded by a package layer 260, in accordance with some embodiments. In some embodiments, the package layer 260 has a bottom surface 262 that is substantially coplanar with the active surface 202 of the integrated circuit chips 200. In some embodiments, the package layer 260 has a top surface that is substantially coplanar with the non-active surface of the integrated circuit chips 200.

In some embodiments, the package layer 260 is in direct contact with the semiconductor substrate 210, the passivation layer 220, and the protection layer 250. In some embodiments, each of the integrated circuit chips 200 has a chip edge 212 in direct contact with the package layer 260. As a result, there is an interface 360 between the integrated circuit chips 200 (or the semiconductor substrate 210) and the package layer 260. In some embodiments, the interface 360 is substantially coplanar with the chip edge 212.

In some embodiments, the package layer 260 includes a polymer material. In some embodiments, the package layer 260 includes a molding compound. The material of the package layer 260 is different from the material of the semiconductor substrate 210. In some embodiments, the material of the package layer 260 is different from the material of the passivation layer 220 and/or the protection layer 250.

The package layer 260 also continuously surrounds multiple conductive features 270, as shown in FIG. 1 in accordance with some embodiments. In some embodiments, the conductive features 270 are on two opposite sides of the integrated circuit chips 200. In some other embodiments, the conductive features 270 discontinuously or discretely surround the integrated circuit chips 200. In some embodiments, there is one or more of the conductive features 270 between two of the integrated circuit chips 200.

In some embodiments, the conductive features 270 are conductive pillars or other suitable structures. The conductive features 270 may be referred to as through interposer vias (TIVs). In some embodiments, the conductive features 270 include Cu, Al, nickel (Ni), platinum (Pt), lead-free solder (e.g., SnAg, SnCu, SnAgCu), another suitable conductive material, or a combination thereof.

Many variations and/or modifications can be made to embodiments of the disclosure. In some other embodiments, the package structure 100 does not include the conductive features 270.

As shown in FIG. 1, the package structure 100 also includes a redistribution structure 300 below the bottom surface 262 of the package layer 260, in accordance with some embodiments. The redistribution structure 300 is electrically connected to the connectors 240 of the integrated circuit chips 200 and the conductive features 270. In some embodiments, the front side (the active surface 202) of the integrated circuit chips 200 faces the redistribution structure 300. In some other embodiments, the back side (the non-active surface) of the integrated circuit chips 200 faces the redistribution structure 300.

The redistribution structure 300 includes one or more redistribution layers and one or more passivation layers. For example, the redistribution structure 300 includes redistribution layers 310 in a passivation layer 320.

In some embodiments, the passivation layer 320 includes a region 320A and a region 320B adjoining the region 320A, as shown in FIG. 1. In some embodiments, the region 320B continuously surrounds the region 320A. In some embodiments, there is a boundary 322 between the region 320A and the region 320B. In some embodiments, the boundary 322 is substantially aligned to the chip edge 212, as shown in FIG. 1.

The passivation layer 320 may include multiple sub-layers. In some embodiments, the passivation layer 320 in the redistribution structure 300 is made of polybenzoxazole (PBO), benzocyclobutene (BCB), silicone, acrylates, siloxane, another suitable material, or a combination thereof. In some other embodiments, the passivation layer 320 in the redistribution structure 300 is made of non-organic materials. The non-organic materials includes silicon oxide, un-doped silicate glass, silicon oxynitride, solder resist (SR), silicon nitride, silicon carbide, hexamethyldisilazane (HMDS), another suitable material, or a combination thereof.

Each of the redistribution layers 310 in the passivation layer 320 includes multiple redistribution lines. In some embodiments, one or more of the redistribution lines in the redistribution layers 310 partially vertically overlap the chip edge 212 and extend along a direction intersecting the chip edge 212, as shown in FIG. 1. In some embodiments, one or more of the redistribution lines in the redistribution layers 310 extend across the boundary 322 between the region 320A and the region 320B.

In some embodiments, the redistribution layers 310 in the redistribution structure 300 are made of metal materials. The metal material includes copper (Cu), Cu alloy, aluminum (Al), Al alloy, tungsten (W), W alloy, titanium (Ti), Ti alloy, tantalum (Ta), Ta alloy, another suitable material, or a combination thereof.

The package structure 100 further includes multiple bumps 330 below the passivation layer 320, as shown in FIG. 1 in accordance with some embodiments. The bumps 330 are electrically connected to the integrated circuit chips 200 through the redistribution layers 310 of the redistribution structure 300. The bumps 330 and the integrated circuit chips 200 are on two opposite sides of the redistribution structure 300. In some embodiments, the bumps 330 are not directly under the interface 360 between the integrated circuit chips 200 and the package layer 260. In some embodiments, none of the bumps 330 vertically overlaps the chip edge 212 and a chip corner of the integrated circuit chip 200.

In some embodiments, the bumps 330 are arranged within the region 320A and the region 320B of the passivation layer 320. In some embodiments, some of the bumps 330 are next to the boundary 322 and arranged along the boundary 322 without overlapping the boundary 322. In some embodiments, none of the bumps 330 is aligned to the boundary 322 or directly under the boundary 322.

In some embodiments, the bumps 330 include solder bumps, solder balls, metal pillars, other suitable connectors, or a combination thereof. In some embodiments, the (minimum) bump pitch P between two adjacent bumps of the bumps 330 is in a range from about 300 μm to about 500 μm. In some embodiments, some of the bumps 330 have substantially the same bump pitch. However, embodiments of the disclosure are not limited thereto. In some other embodiments, some of the bumps 330 have different bump pitches.

As shown in FIG. 1, there is an under-bump metallurgy (UBM) element 340 between the redistribution structure 300 and one of the bumps 330, in accordance with some embodiments. In some embodiments, the UBM element 340 is substantially aligned to one of the bumps 330. In some embodiments, there are UBM elements 340 and each of the UBM elements 340 is substantially aligned to one of the bumps 330. In some embodiments, the UBM element 340 is in direct contact with one of the bumps 330. In some embodiments, the width W of the UBM element 340 is in a range from about 150 μm to about 300 μm.

In some embodiments, the UBM element 340 includes a diffusion barrier layer and a seed layer. The diffusion barrier layer may include tantalum nitride, titanium nitride, tantalum, titanium, another suitable diffusion barrier material, or a combination thereof. The seed layer may be a copper seed layer on the diffusion barrier layer. The copper seed layer may include copper or one of the copper alloys that include silver, chromium, nickel, tin, gold, or a combination thereof.

As shown in FIG. 1, an element 280 is stacked over the integrated circuit chips 200, in accordance with some embodiments. The element 280 and the redistribution structure 300 are on two opposite sides of the integrated circuit chips 200. The element 280 is electrically connected to the integrated circuit chips 200 through the conductive features 270 and the redistribution structure 300.

In some embodiments, the element 280 includes a package structure that contains one or more integrated circuit chips. However, embodiments of the disclosure are not limited thereto. In some other embodiments, the element 280 is an integrated circuit chip. The element 280 can be varied according to requirements.

In some embodiments, one or more connectors 290 are used to bond the element 280 over the integrated circuit chips 200, as shown in FIG. 1. The connectors 290 are electrically connected to conductive features 285, such as conductive pads, in the element 280. The connectors 290 include solder bumps, solder balls, metal pillars, other suitable connectors, or a combination thereof.

Although FIG. 1 shows that there is one element 280 over the integrated circuit chips 200, embodiments of the disclosure are not limited thereto. In some other embodiments, there are multiple elements 280 over the integrated circuit chips 200.

Many variations and/or modifications can be made to embodiments of the disclosure. In some other embodiments, the package structure 100 does not include the element 280 and the connectors 290.

In some embodiments, the package structure 100 shown in FIG. 1 is further bonded to a substrate 350 through the bumps 330. In some embodiments, the substrate 350 is a printed circuit board, another package structure, or another suitable substrate. The bumps 330 are electrically connected to conductive features 355, such as conductive pads, in the substrate 350. In some embodiments, the conductive features 355 and the bumps 330 are substantially aligned to each other. In some embodiments, the conductive features 355 are not aligned to the chip edge 212 are or misaligned to the chip edge 212.

Figure 2:
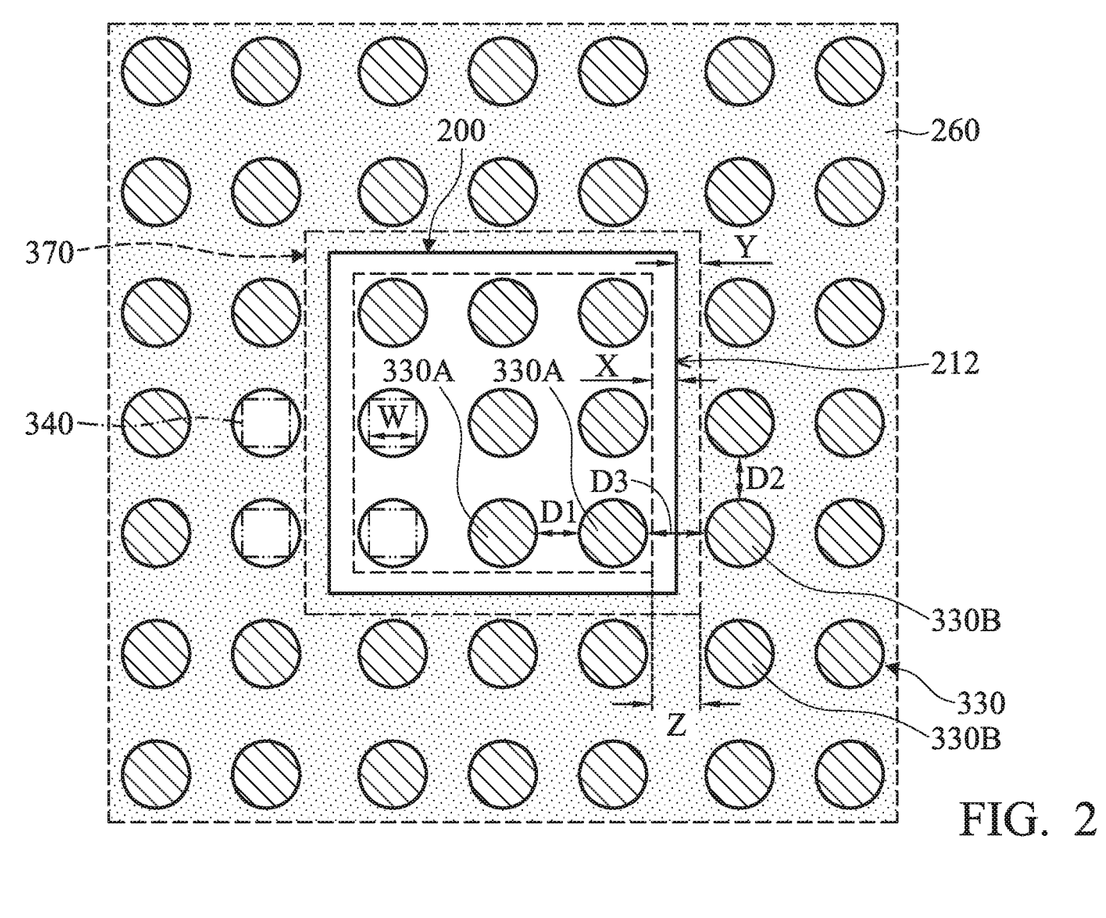
FIG. 2 is a top view of a package structure, in accordance with some embodiments.

FIG. 2 is a top view of a package structure, in accordance with some embodiments. In some embodiments, FIG. 2 shows a portion of the package structure 100 shown in FIG. 1. FIG. 2 illustrates the integrated circuit chip 200, the package layer 260, the bumps 330 and some of the UBM elements 340 without other features in the package structure 100 for a better understanding of the structure. In some embodiments, the chip edge 212 shown in FIG. 2 is substantially aligned to the interface 360 between the integrated circuit chip 200 and the package layer 260 and/or the boundary 322 between the regions 320A and 320B of the passivation layer 320.

As shown in FIG. 2, the integrated circuit chip 200 is embedded in the package layer 260, in accordance with some embodiments. In some embodiments, the bumps 330 are projected onto the semiconductor substrate 210 of the integrated circuit chip 200 or the package layer 260. The projections of the bumps 330 are taken along a plane that is parallel to the main surface of the integrated circuit chip 200. The main surface of the integrated circuit chip 200 may be the active surface or the non-active surface of the integrated circuit chip 200.

As shown in FIG. 2, the chip edge 212 is separated from the projections of the bumps 330, in accordance with some embodiments. In some embodiments, the chip edge 212 is not covered by any one of the projections of the bumps 330 (in a top view or a cross-sectional view). In some embodiments, the chip edge 212 does not extend across any of the projections of the bumps 330.

In accordance with some embodiments, the bumps 330 comprise bumps 330A and 330B that are on two opposite sides of the chip edge 212. For example, the bumps 330A and 330B are on inner and outer sides of the chip edge 212, respectively. The bumps 330A and 330B may be referred to as inner and outer bumps, respectively. In some embodiments, the bumps 330A and 330B are arranged to be substantially aligned to each other. In some other embodiments, one of the bumps 330A is arranged to be not aligned to one of the bumps 330B.

As shown in FIG. 2, the bumps 330A are projected onto the active surface 202 of the semiconductor substrate 210 without overlapping and intersecting the chip edge 212 and the package layer 260, in accordance with some embodiments. In some embodiments, the projections of the bumps 330A are arranged in a row, a ring or an array inside the chip edge 212. In some embodiments, the bump pitch between each two neighboring bumps of the bumps 330A is in a range from about 300 µm to about 500 µm.

In some embodiments, the bumps 330A comprise one or more center bumps and peripheral bumps. The peripheral bumps are arranged along the chip edge 212 and are closer to the chip edge 212 than the center bumps. In some embodiments, all the center and peripheral bumps of the bumps 330A are surrounded by the chip edge 212. In some embodiments, each of the bumps 330A does not vertically overlap and cover the chip edge 212.

In some embodiments, the bumps 330A are spaced apart from the chip edge 212 along a direction that is substantially parallel to the main surface of the integrated circuit chip 200. In some embodiments, the chip edge 212 is separated from the projections of the peripheral bumps 330A on the integrated circuit chip 200 by a distance X. In some embodiments, the distance X is in a range from about 15 µm to about 100 µm. In some embodiments, there are multiple different distances between the chip edge 212 and the projections of multiple bumps 330A. In some embodiments, the ratio between any two of the distances is in a range from about 0.5 to about 2.

As shown in FIG. 2, the bumps 330B are projected onto the bottom surface 262 of the package layer 260 without overlapping and intersecting the chip edge 212 and the semiconductor substrate 210, in accordance with some embodiments. In some embodiments, the bumps 330B are arranged in a row, a ring or an array outside the chip edge 212. In some embodiments, the bump pitch between each two neighboring bumps of the bumps 330B is in a range from about 300 µm to about 500 The bumps 330A and 330B have the same or different bump pitches according to requirements.

In some embodiments, the bumps 330B discontinuously or discretely surround the chip edge 212. In some embodiments, each of the bumps 330B does not vertically overlap and cover the chip edge 212. In some embodiments, the bumps 330B and the peripheral bumps of the bumps 330A are right next to each other. In some embodiments, there is no bump between the bumps 330B and the peripheral bumps of the bumps 330A.

In some embodiments, the bumps 330B are spaced apart from the chip edge 212 along a direction that is substantially parallel to the main surface of the integrated circuit chip 200. In some embodiments, the chip edge 212 is separated from the projections of the bumps 330B on the package layer 260 by a distance Y. In some embodiments, the distance Y is in a range from about 15 µm to about 100 In some embodiments, there are multiple different distances between the chip edge 212 and the projections of multiple bumps 330B. In some embodiments, the ratio between any two of the distances is in a range from about 0.5 to about 2.

In some embodiments, the distance Y is substantially equal to the distance X. However, embodiments of the disclosure are not limited thereto. In some other embodiments, the distance Y is less or greater than the distance X.

As shown in FIG. 2, there is a distance $D_1$ between two neighboring bumps of the bumps 330A. There is a distance $D_2$ between two neighboring bumps of the bumps 330B. In some embodiments, the distance $D_2$ is substantially equal to the distance $D_1$.

However, embodiments of the disclosure are not limited thereto. In some other embodiments, the distance $D_2$ is less or greater than the distance $D_1$. In other words, the bumps 330B may have a concentrated or sparse arrangement in comparison with the bumps 330A.

As shown in FIG. 2, there is a distance $D_3$ between one of the bumps 330A and one of the bumps 330B that are right next to the chip edge 212. In some embodiments, the distance $D_3$ is in a range from about 30 µm to about 200 In some embodiments, the distance $D_3$ is in a range from about 50 µm to about 200 In some embodiments, the ratio ($D_3/P$) of the distance $D_3$ to the (minimum) bump pitch P between two adjacent bumps of the bumps 330A or 330B is in a range from about 0.1 to about 0.15.

In some embodiments, the distance $D_1$ is less than the distance $D_3$. In some embodiments, the distance $D_2$ is less than the distance $D_3$. However, embodiments of the disclosure are not limited thereto. In some other embodiments, the distance $D_1$ and/or the distance $D_2$ is substantially equal to or greater than the distance $D_3$.

In accordance with some embodiments, a keep-out zone 370 is defined in the package structure 100 shown in FIGS. 1 and 2. The bumps 330A and 330B are kept away from the chip edge 212 by the keep-out zone 370. In other words, there is no bump projected in the keep-out zone 370.

As shown in FIG. 2, the keep-out zone 370 is substantially aligned to the chip edge 212 and extends along the chip edge 212, in accordance with some embodiments. In some embodiments, the keep-out zone 370 continuously surrounds the bumps 330A. In some embodiments, the bumps 330B discontinuously or discretely surround the keep-out zone 370. In some embodiments, the keep-out zone 370 is a hollow ring region.

In some embodiments, the keep-out zone 370 has a width Z spanning the chip edge 212. In some embodiments, the width Z is in a range from about 30 µm to about 200 µm. In some embodiments, the width Z is in a range from about 50 µm to about 200 µm.

In some embodiments, the boundary of the keep-out zone 370 is spaced apart from the chip edge 212 by a distance that is in a range from about 15 µm to about 100 µm. Although FIG. 2 shows that multiple boundaries of the keep-out zone 370 are spaced apart from the chip edge 212 by substantially the same distance, embodiments of the disclosure are not limited thereto. In some other embodiments, multiple boundaries of the keep-out zone 370 are spaced apart from the chip edge 212 by different distances.

As mentioned above, each of the UBM elements 340 is substantially aligned to one of the bumps 330 comprising the bumps 330A and 330B. In some embodiments, the UBM elements 340 comprises center, peripheral and outer UBM elements that are substantially aligned to and connect to the center, peripheral and outer bumps, respectively.

As shown in FIG. 2, the UBM elements 340 are projected onto the integrated circuit chip 200 or the package layer 260, in accordance with some embodiments. The projections of the UBM elements 340 are taken along a plane that is parallel to the main surface of the integrated circuit chip 200.

In some embodiments, the chip edge 212 is separated from the projections of the UBM elements 340. In some embodiments, the chip edge 212 is free from being covered by any of the UBM elements 340. In some embodiments, the chip edge 212 does not extend across the projections of the UBM elements 340 and does not overlap the projections of the UBM elements 340. In some embodiments, no UBM element 340 is projected in the keep-out zone 370.

As mentioned above, in some embodiments, the conductive features 355 of the substrate 350 (shown in FIG. 1) and the bumps 330, which are bonded to the conductive features 355, are substantially aligned to each other. In some embodiments, the chip edge 212 is spaced apart from the projections of the conductive features 355 on the integrated circuit chip 200 and the package layer 260. As a result, the conductive features 355 do not vertically overlap the chip edge 212, as shown in FIG. 1. In some embodiments, no conductive feature 355 is projected in the keep-out zone 370.

Embodiments of the disclosure are not limited thereto. In some other embodiments, one or more of the conductive features of the substrate 350 partially overlap the chip edge 212.

Figure 3:
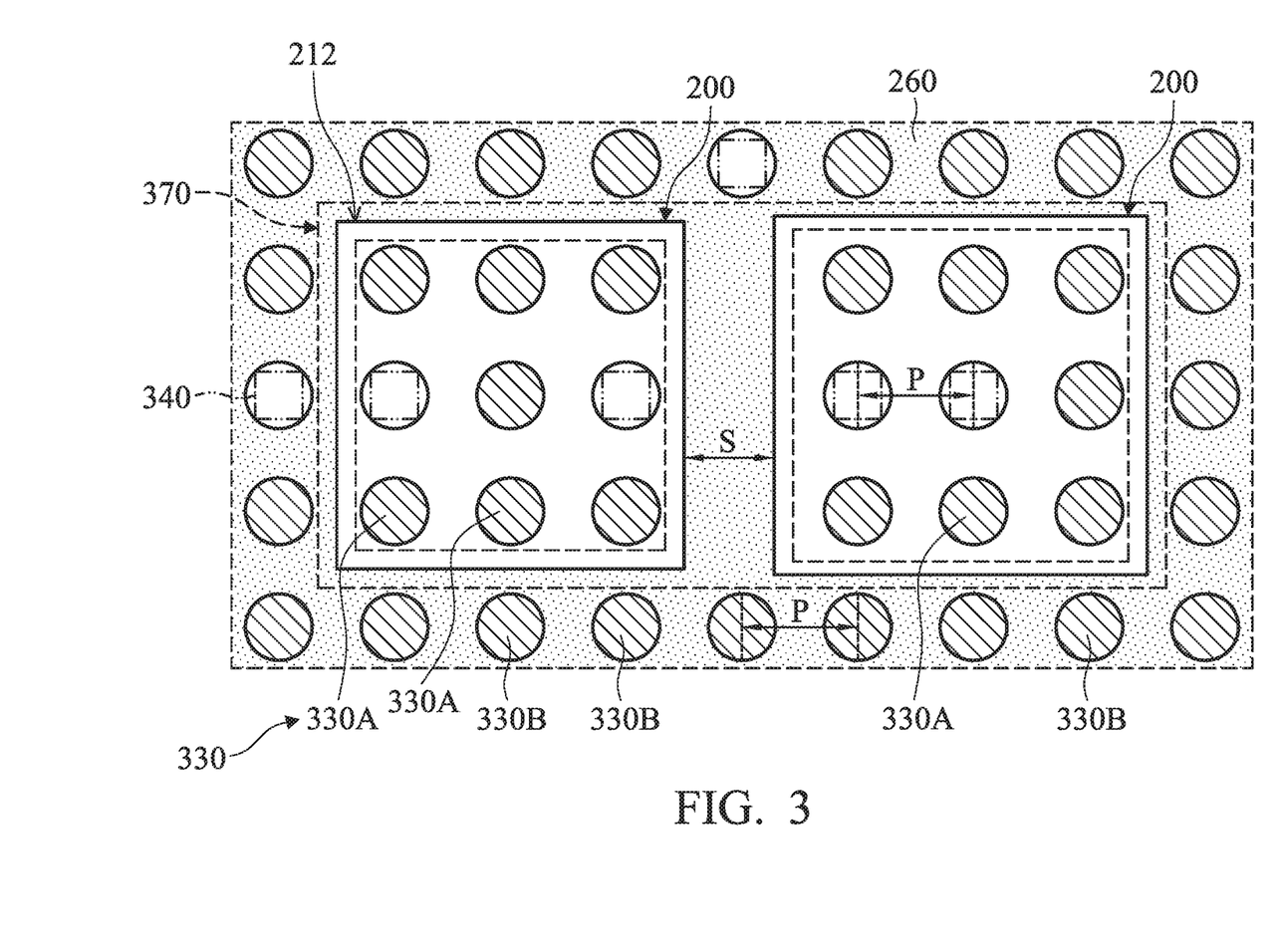
FIG. 3 is a top view of a package structure, in accordance with some embodiments.

Many variations and/or modifications can be made to embodiments of the disclosure. FIG. 3 is a top view of a package structure, in accordance with some embodiments. In some embodiments, FIG. 3 shows a portion of the package structure 100 shown in FIG. 1. The package structure shown in FIG. 3 is similar to the package structure illustrated in the aforementioned embodiments shown in FIGS. 1 and 2.

As shown in FIG. 3, multiple integrated circuit chips 200 are embedded in the package layer 260, in accordance with some embodiments. Each of the integrated circuit chips 200 has a chip edge 212. In some embodiments, the chip edges 212 of the integrated circuit chips 200 are right next to each other.

In some embodiments, the interval S between two adjacent chip edges 212 of the integrated circuit chips 200 is in a range from about 20 µm to about 100 µm. In some embodiments, the interval S is in a range from about 50 µm to about 100 µm. In some embodiments, the interval S is less than the bump pitch P between two adjacent bumps of the bumps 330A and 330B.

As shown in FIG. 3, the projections of the bumps 330A are inside the chip edges 212 and the projections of the bumps 330B are outsides the chip edges 212, in accordance with some embodiments. In some embodiments, the projections of the bumps 330B are further outside the interval S between the integrated circuit chips 200. In some embodiments, the bumps 330B are arranged outside the interval S so that the chip edges 212 are partially surrounded by the bumps 330B.

In some embodiments, there is no bump projected between the integrated circuit chips 200. In some embodiments, the shortest distance between two adjacent bumps of the bumps 330A, which are inside different chip edges 212, is greater than the shortest distance between two adjacent bumps of the bumps 330A, which are inside the same chip edges 212.

As shown in FIG. 3, the UBM elements 340 are projected onto the integrated circuit chip 200 or the package layer 260, in accordance with some embodiments. In some embodiments, the projections of the UBM elements 340 are arranged outside a region (the interval S) between the integrated circuit chips 200.

In some embodiments, there is no UBM element projected between the integrated circuit chips 200. In some embodiments, the shortest distance between two adjacent UBM elements 340, which are inside different chip edges 212, is greater than the shortest distance between two adjacent UBM elements 340, which are inside the same chip edges 212.

As shown in FIG. 3, the keep-out zone 370 extends along the chip edges 212, in accordance with some embodiments. In some embodiments, the region between the integrated circuit chips 200 is substantially completely within the keep-out zone 370. In some embodiments, there are different distances between the boundary of the keep-out zone 370 and the chip edges 212. However, embodiments of the disclosure are not limited thereto. In some other embodiments, there is substantially the same distance between the boundary of the keep-out zone 370 and the chip edges 212.

Many variations and/or modifications can be made to embodiments of the disclosure. For example, although the embodiments shown in FIG. 3 illustrate that there is no bump projected between the integrated circuit chips 200, embodiments of the disclosure are not limited thereto. Some other embodiments of the disclosure include one or more bumps projected between the integrated circuit chips 200.

Figure 4:
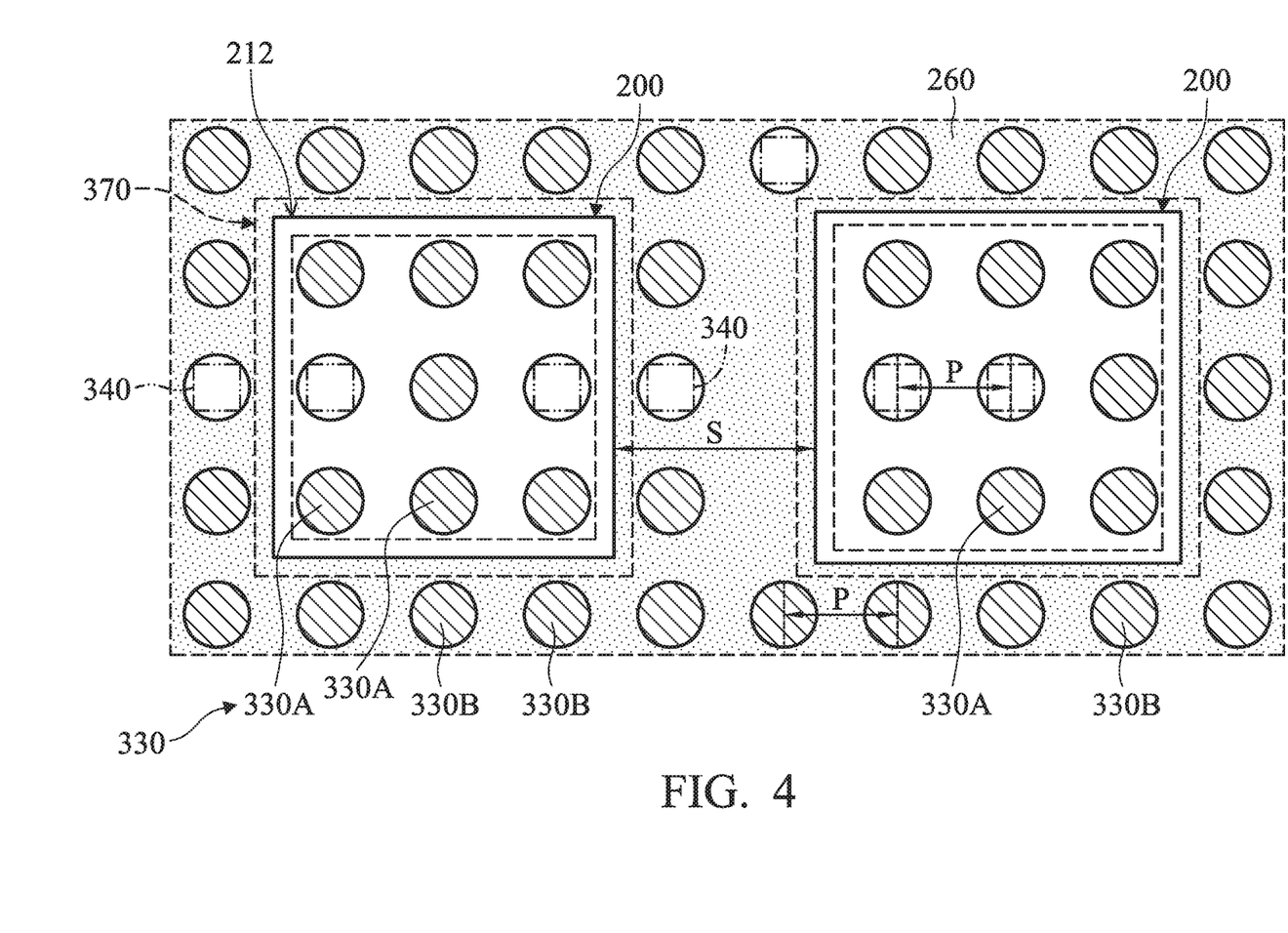
FIG. 4 is a top view of a package structure, in accordance with some embodiments.

FIG. 4 is a top view of a package structure, in accordance with some embodiments. In some embodiments, FIG. 4 shows a portion of the package structure 100 shown in FIG. 1. The package structure shown in FIG. 4 is similar to the package structure illustrated in the aforementioned embodiments shown in FIGS. 1, 2 and 3.

As shown in FIG. 4, the interval S between two adjacent chip edges 212 is greater than the bump pitch P between two adjacent bumps of the bumps 330A and 330B, in accordance with some embodiments. In some other embodiments, the interval S between two adjacent chip edges 212 is equal to the bump pitch P between two adjacent bumps of the bumps 330A and 330B. In some embodiments, the interval S between two adjacent chip edges 212 is in a range from about 20 μm to about 100 μm. In some embodiments, the interval S is in a range from about 50 μm to about 100 μm.

As shown in FIG. 4, one or more of the bumps 330B are inside the region (the interval S) between the integrated circuit chips 200, in accordance with some embodiments. In some embodiments, one of the bumps 330B inside the region between the integrated circuit chips 200 is right next to the chip edges 212. In some embodiments, the bumps 330B inside and outside the region between the integrated circuit chips 200 together surround each side of the chip edges 212.

In some embodiments, one of the bumps 330B inside the region is spaced apart from two adjacent chip edges 212 by different distances. However, embodiments of the disclosure are not limited thereto. In some other embodiments, one of the bumps 330B inside the region is spaced apart from two adjacent chip edges 212 by substantially the same distance.

As shown in FIG. 4, one or more of the UBM elements 340 are projected onto the region between the integrated circuit chips 200, in accordance with some embodiments. In some embodiments, one of the UBM elements 340 inside the region is spaced apart from two adjacent chip edges 212 by different distances.

As shown in FIG. 4, there are multiple keep-out zones 370, in accordance with some embodiments. Each of the keep-out zones 370 extends along one of the chip edges 212. The keep-out zones 370 are separated from each other. In some embodiments, the region between the integrated circuit chips 200 is partially within the keep-out zones 370.

Embodiments of the disclosure provide a package structure. The package structure includes an integrated circuit chip having a chip edge embedded in a package layer. The package structure also includes a redistribution structure below the integrated circuit chip and the package layer. The package structure further includes bumps below the redistribution structure. The bumps are configured to bond the package structure onto a substrate, such as a circuit board. In some cases, there may be overlying stress that is caused by a mismatch of the CTE between the integrated circuit chip and the package layer, and propagates into the redistribution structure. Also, there may be underlying stress that is caused by a mismatch of the CTE between the bumps and the circuit board, and propagates into the redistribution structure. The bumps, which are right adjacent to the interface between the integrated circuit chip and the package layer, are spaced apart from the interface without overlapping the interface. As a result, the underlying stress is misaligned to the overlying stress. Stress on the redistribution structure is distributed and relieved. Accordingly, damage to the redistribution structure that may result from stress concentration along the interface or the chip edge is mitigated or prevented. Therefore, reliability of the package structure is significantly enhanced.

In accordance with some embodiments, the bumps are separated from the chip edge of the integrated circuit chips by a distance (such as the distance X or Y). The distance is in a range from about 15 μm to about 100 μm. In accordance with some embodiments, a keep-out zone (such as the keep-out zone 370) is defined in the package structure to keep the bumps away from the chip edge. The width of the keep-out zone is in a range from about 30 μm to about 200 μm.

In some cases, the distance should be substantially equal to or greater than about 15 μm, and the width of the keep-out zone should be substantially equal to or greater than about 30 μm. If the distance is less than about 15 μm or the width is less than about 30 μm, the underlying stress and the overlying stress, which is caused by a mismatch of the CTE between heterogeneous materials, overlaps with each other. Stress, which propagates from different directions, is focused and concentrated on substantially the same position of the redistribution structure. As a result, cracks may be formed in one or more of the redistribution layers and one or more of the passivation layers of the redistribution structure. However, embodiments of the disclosure are not limited thereto. In some other cases, the distance may be less than about 15 μm or the width may be less than about 30 μm.

In some cases, the distance should be substantially equal to or less than about 100 μm, and the width of the keep-out zone should be substantially equal to or less than about 200 μm. If the distance is greater than about 100 μm or the width is greater than about 200 μm, some issues may arise. For example, it may be difficult to arrange the bumps and the bump placement layout may be limited. Also, the number of bumps in a predetermined package area may be limited. However, embodiments of the disclosure are not limited thereto. In some other cases, the distance may be greater than about 100 µm or the width may be greater than about 200 µm.

Embodiments of the disclosure are not limited to the package structure shown in FIGS. 1-4. Many variations and/or modifications can be made to embodiments of the disclosure. For example, although the embodiments shown in FIG. 1 provide a package structure having a "fan-out" feature, embodiments of the disclosure are not limited thereto. Some other embodiments of the disclosure include a package structure having a "fan-in" feature.

According to some embodiments, the disclosure is applied to a package structure including a redistribution layer connected to a bump. The redistribution layer extends across a chip edge of an integrated circuit chip while the bumps are not aligned to the chip edge as viewed from a top view. Many variations and/or modifications can be made to embodiments of the disclosure. In some other embodiments, the disclosure can be applied to any suitable structure including conductive lines, which overlap an interface between features made of different materials and connect to a bump.

In accordance with some embodiments, a package structure is provided. The package structure includes a redistribution layer and a first integrated circuit chip having a first chip edge and a second integrated circuit chip having a second chip edge over the redistribution layer. The package structure also includes first bumps electrically connected to the first integrated circuit chip through the redistribution layer. In addition, the first bumps overlap the first integrated circuit chip and are arranged along a first chip edge of the first integrated circuit chip. The package structure further includes second bumps electrically connected to the first integrated circuit chip through the redistribution layer without overlapping the first integrated circuit chip and the second integrated circuit chip. In addition, none of the second bumps is arranged between the first chip edge and the second chip edge.

In accordance with some embodiments, a package structure is provided. The package structure includes a redistribution layer and a first integrated circuit chip having a first chip edge and a second integrated circuit chip having a second chip edge over the redistribution layer. The package structure also includes a first bump and a second bump connected to the redistribution layer. In addition, the first bump is directly under the first integrated circuit chip and the second bump is directly under a region between the first chip edge and the second chip edge, and a distance between the second bump and the first chip edge is different from a distance between the first bump and the first chip edge.

In accordance with some embodiments, a package structure is provided. The package structure includes a package layer and a first chip in the package layer, and the first chip has a first chip edge. The package structure also includes a second chip in the package layer, and the second chip has a second chip edge. The package structure further includes first bumps under the first chip and second bumps under the second chip. The package structure also includes third bumps under the package layer without overlapping the first chip and the second chip. In addition, a distance between the first chip edge and the second chip edge is smaller than a distance between two of the neighboring first bumps.

In accordance with some embodiments, a package structure is provided. The package structure includes a molding compound. The package structure also includes an integrated circuit chip having a chip edge in the molding compound. The package structure further includes a passivation layer below the integrated circuit chip and the molding compound. In addition, the package structure includes a redistribution layer in the passivation layer. The package structure also includes first bumps electrically connected to the integrated circuit chip through the redistribution layer. The first bumps are inside the chip edge and arranged along the chip edge. The package structure further includes second bumps electrically connected to the integrated circuit chip through the redistribution layer. The second bumps are outside the chip edge and arranged along the chip edge. The first bumps are next to the second bumps. The first and second bumps are spaced apart from the chip edge.

In accordance with some embodiments, a package structure is provided. The package structure includes a package layer. The package structure also includes an integrated circuit chip having a chip edge in the package layer. The package structure further includes a passivation layer below the integrated circuit chip and the package layer. The passivation layer comprises a first region and a second region adjoining the first region. There is a boundary between the first and second regions. The boundary is substantially aligned to the chip edge. In addition, the package structure includes a redistribution layer in the passivation layer. The redistribution layer extends across the boundary. The package structure also includes first bumps electrically connected to the integrated circuit chip through the redistribution layer. The first bumps are in the first region. The package structure further includes second bumps electrically connected to the integrated circuit chip through the redistribution layer. The second bumps are in the second region. The first bumps and the second bumps are next to the boundary and arranged along the boundary without overlapping the boundary.

In accordance with some embodiments, a package structure is provided. The package structure includes a first chip having a first chip edge in a package layer. The package structure also includes a second chip having a second chip edge in the package layer. The second chip edge is next to the first chip edge. There is an interval between the first and second chip edges. The package structure further includes a passivation layer below the first chip, the second chip and the package layer. In addition, the package structure includes redistribution lines in the passivation layer. The package structure also includes bumps electrically connected to the first chip and the second chip through the redistribution lines. The bumps include first bumps inside the first chip edge. The bumps also include second bumps inside the second chip edge. The bumps further include third bumps outside the first and second chip edges. There is a bump pitch between one of the first bumps and one of the third bumps that are next to each other. The third bumps are arranged outside a region between the first and second chip edges to partially surround the first and second chip edges if the interval is less than the bump pitch. One or more of the third bumps are arranged within the region if the interval is not less than the bump pitch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a redistribution layer;
    a first integrated circuit chip having a first corner, a second corner, and a first chip edge and a second integrated circuit chip having a third corner, a fourth corner, and a second chip edge over the redistribution layer;
    first bumps electrically connected to the first integrated circuit chip through the redistribution layer, wherein the first bumps overlap the first integrated circuit chip and are arranged along a first chip edge of the first integrated circuit chip in top view; and
    second bumps electrically connected to the first integrated circuit chip through the redistribution layer without overlapping the first integrated circuit chip and the second integrated circuit chip, wherein the first corner and the second corner of the first integrated circuit chip and the third corner and the fourth corner of the second integrated circuit chip form a first region in top view, and no bump overlaps the first region.

2. The package structure as claimed in claim 1, wherein the second bumps partially surround the first chip edge and the second chip edge in top view.

3. The package structure as claimed in claim 1, further comprising:
    a molding compound surrounding the first integrated circuit chip and the second integrated circuit chip, wherein the molding compound has a first portion sandwiched between the first chip edge and the second chip edge without overlapping the first bumps and the second bumps in a top view.

4. The package structure as claimed in claim 1, further comprising:
    first under-bump metallurgy (UBM) elements between the redistribution layer and the first bumps and arranged along the first chip edge; and
    second UBM elements between the redistribution layer and the second bumps and arranged along the first chip edge, wherein none of the first and second UBM elements overlaps the first chip edge.

5. The package structure as claimed in claim 1, wherein there is a keep-out zone between the first bumps and the second bumps in top view and a width of the keep-out zone is in a range from about 30 μm to about 200 μm.

6. A package structure, comprising:
    a redistribution layer;
    a first integrated circuit chip having a first chip edge and a second integrated circuit chip having a second chip edge over the redistribution layer, wherein a first sidewall of the first chip edge is arranged facing a second sidewall of the second chip edge;
    first bumps directly under the first integrated circuit chip;
    second bumps outside the first chip edge and the second chip edge in top view,
    wherein a first line of the second bumps are aligned along the first sidewall of the first chip edge and a second line of the second bumps are aligned along the second sidewall of the second chip edge in top view, and a number of the first line of the second bumps is greater than a number of the second line of the second bumps.

7. The package structure as claimed in claim 6, wherein two of the first bumps are spaced apart from each other by a first distance, and a minimum distance between one of the second bumps and the two of the first bumps is greater than the first distance, and the one of the second bumps is directly adjacent to the first chip edge and the second chip edge, and the two of the first bumps and the one of the second bumps are substantially collinear.

8. The package structure as claimed in claim 6, wherein the one of the second bumps is spaced apart from the first chip edge and the second chip edge by different distances in a top view.

9. The package structure as claimed in claim 6, further comprising:
    first under-bump metallurgy (UBM) elements between the redistribution layer and the first bumps; and
    second UBM elements between the redistribution layer and the second bumps,
    wherein the first UBM elements and the second UBM elements are arranged without overlapping the first chip edge and the second chip edge.

10. A package structure, comprising:
    a package layer;
    a first chip in the package layer, wherein the first chip has a first chip edge;
    a second chip in the package layer, wherein the second chip has a second chip edge;
    first bumps under the first chip;
    second bumps under the second chip,
    wherein a distance between the first chip edge and the second chip edge is smaller than a pitch between two of the first bumps positioned next to each other.

11. The package structure as claimed in claim 10, further comprising:
    third bumps under the package layer without overlapping the first chip and the second chip, wherein the third bumps partially surround the first chip edge and the second chip edge in a top view.

12. The package structure as claimed in claim 11, wherein a first group of the third bumps are aligned along a first side of the first chip edge and a first side of the second chip edge, and the first side of the first chip edge is substantially aligned collinear with the first side of the second chip edge.

13. The package structure as claimed in claim 12, wherein a second side of the first chip edge faces a second side of the second chip edge, and a first portion of the package layer is sandwiched between the second side of the first chip edge and the second side of the second chip edge, and no bump is disposed under the first portion of the package layer.

14. The package structure as claimed in claim 10, wherein the distance between the first chip edge and the second chip edge is smaller than a pitch between one of the first bumps and one of the second bumps neighboring with each other.

15. The package structure as claimed in claim 12, wherein the first bumps and the second bumps are surrounded by the third bumps.

16. The package structure as claimed in claim 6, wherein a shortest distance between the first line of the second bumps and the first sidewall of the first chip edge is greater than a shortest distance between the second line of the second bumps and the second sidewall of the second chip edge in top view.

17. The package structure as claimed in claim 6, wherein the first line of the second bumps are substantially collinear and parallel to the first sidewall of the first chip edge, the second line of the second bumps are also substantially collinear and parallel to the first sidewall of the first chip edge.

18. The package structure as claimed in claim 6, wherein the first integrated circuit chip has a first corner and a second corner at two ends of the first sidewall of the first chip edge, the second integrated circuit chip has a third corner and a fourth corner at two ends of the second sidewall of the second chip edge, the first corner and the second corner of the first integrated circuit chip and the third corner and the fourth corner of the second integrated circuit chip form a first region in top view, and none of the second line of the second bumps is positioned in the first region.

19. The package structure as claimed in claim 18, wherein no bump in the first region is closer to the second sidewall of the second chip edge than the first sidewall of the first chip edge.

20. The package structure as claimed in claim 6, further comprising:
- a package layer surrounding the first integrated circuit chip and the second integrated circuit chip over the redistribution layer; and
- a first pillar formed through the package layer,
- wherein the first pillar overlaps at least one of the second bumps.

* * * * *